(12) United States Patent
Drury et al.

(10) Patent No.: US 11,751,332 B2
(45) Date of Patent: Sep. 5, 2023

(54) CABLELESS INTERCONNECT

(71) Applicant: SOFTIRON LIMITED, Chilworth (GB)

(72) Inventors: Robert Drury, Fotherby (GB); Sean Michael Robin, San Jose, CA (US)

(73) Assignee: SOFTIRON LIMITED, London (GB)

( * ) Notice: Subject to any disclaimer, the term of this patent is extended or adjusted under 35 U.S.C. 154(b) by 0 days.

(21) Appl. No.: 17/488,459

(22) Filed: Sep. 29, 2021

(65) Prior Publication Data

US 2022/0104357 A1 Mar. 31, 2022

Related U.S. Application Data

(60) Provisional application No. 63/085,970, filed on Sep. 30, 2020.

(51) Int. Cl.
*H05K 1/14* (2006.01)

(52) U.S. Cl.
CPC .................. *H05K 1/141* (2013.01)

(58) Field of Classification Search
CPC ..................................... H05K 1/141
USPC ......................................... 361/785
See application file for complete search history.

(56) References Cited

U.S. PATENT DOCUMENTS

| 7,258,569 | B1 | 8/2007 | Johnson et al. ............... 439/378 |
| 7,660,409 | B1 * | 2/2010 | Czerwiec ............. H05K 1/0207 |
| | | | 379/325 |
| 2007/0026867 | A1 * | 2/2007 | Karabinis .......... H04B 7/18539 |
| | | | 455/447 |
| 2007/0112988 | A1 | 5/2007 | Yang et al. ................... 710/301 |
| 2016/0041590 | A1 * | 2/2016 | Yu ........................... G06F 1/186 |
| | | | 361/679.32 |

FOREIGN PATENT DOCUMENTS

JP    2020030789 A  *  2/2020  ............. G06F 1/183

OTHER PUBLICATIONS

International Search Report and Written Opinion, Application No. PCT/EP2021/077036, 11 pages, dated Jan. 19, 2022.

* cited by examiner

*Primary Examiner* — Andargie M Aychillhum
(74) *Attorney, Agent, or Firm* — Slayden Grubert Beard PLLC

(57) ABSTRACT

A baseboard includes a first connection configured to electrically interface with a motherboard, a second connection configured to electrically interface with a module, and a switch circuit configured to route data channels and power channels between the motherboard and the module. The first connection is configured to interface with more than one connection protocol or standard. The second connection is configured to interface with the more than one connection protocol or standard. The baseboard allows for cableless connections to allow unobstructed airflow over the components.

19 Claims, 7 Drawing Sheets

CABLELESS INTERCONNECT

CONTINUATION STATEMENT

This application claims priority to U.S. Provisional Application No. 63/085,970, filed Sep. 30, 2020.

FIELD OF THE INVENTION

The present disclosure relates to construction of computers and computer servers and, more specifically, to cableless interconnects between printed circuit boards (PCB) and ancillary modules.

BACKGROUND

When connecting different PCBs of a computer or computer server, cables are often for the signal and power connections. Cables are often connected using connector blocks to meet a particular pinout and protocol or format. For example, a motherboard may connect to a hard drive enclosure using a Serial Advanced Technology Attachment, or Serial ATA ("SATA") format, with push or clip-in connectors and cables running in open air inside the computer enclosure. Electrical connectors may comply with other industry standards, e.g., PATA, SCSI, SAS.

SUMMARY

Embodiments of the present disclosure include a baseboard. The baseboard may include a first connection configured to electrically interface with a motherboard. The baseboard may include a second connection configured to electrically interface with a module. The baseboard may include a switch circuit configured to route data channels and power channels between the motherboard and the module. The first connection may be configured to interface with more than one connection protocol or standard. The second connection may be configured to interface with the more than one connection protocol or standard.

According to one aspect of the invention, there is provided a baseboard, including: a printed circuit board; a motherboard interface configurable to allow communications between the printed circuit board and a motherboard; a first ancillary module interface configurable to allow communications between the printed circuit board and a first ancillary module; and a baseboard management controller that configures the motherboard interface with a protocol or standard of the motherboard and configures the first ancillary module interface with a protocol or standard of the first ancillary module to enable a communication channel between the motherboard and the ancillary module.

Another aspect of the invention provides a chassis computer system, including: baseboard comprising: a printed circuit board; a motherboard interface configurable to allow communications between the printed circuit board and a motherboard; a first ancillary module interface configurable to allow communications between the printed circuit board and a first ancillary module; and a baseboard management controller that configures the motherboard interface with a protocol or standard of the motherboard and configures the first ancillary module interface with a protocol or standard of the first ancillary module to enable a communication channel between the motherboard and the ancillary module; a motherboard; a connector of the motherboard to the baseboard; a first ancillary module; a baseboard connector of the first ancillary module to the baseboard; and a fan.

According to a further aspect of the invention, there is provided a chassis computer system, including: baseboard comprising: a printed circuit board; a motherboard interface configurable to allow communications between the printed circuit board and a motherboard; a first ancillary module interface configurable to allow communications between the printed circuit board and an ancillary module; and a baseboard management controller that configures the motherboard interface with a protocol or standard of the motherboard and configures the ancillary module interface with a protocol or standard of the ancillary module to enable a communication channel between the motherboard and the ancillary module; a motherboard; a connector of the motherboard to the baseboard, wherein the connector is cableless, wherein the motherboard interface allows communications through the connector; an ancillary module; a baseboard connector of the ancillary module to the baseboard, wherein the baseboard connector is cableless, wherein the ancillary module interface allows communications through the baseboard connector; and a fan.

BRIEF DESCRIPTION OF THE DRAWINGS

A more complete understanding of the present embodiments may be acquired by referring to the following description taken in conjunction with the accompanying drawings, in which like reference numbers indicate like features.

DETAILED DESCRIPTION

Preferred embodiments are best understood by reference to FIGS. 1-6 below in view of the following general discussion. The present disclosure may be more easily understood in the context of a high-level description of certain embodiments.

Inventors of embodiments of the present disclosure have discovered that cabling in computers and computer servers may constitute limitations on such technology. Having to ensure a solid physical connection with plastic connectors and using the correct cable each can cause problems in providing computers and computer servers when using cabling. Moreover, specifically designed cables must be used for all unique connections. Finally, cables can contribute to the mean time between failure (MTBF), both directly and indirectly by preventing laminar airflow for cooling.

Embodiments of the present disclosure address one or more of these issues by use of a baseboard printed circuit board (PCB) with associated connectors that is used to interconnect modular components to the motherboard. The connectors can be added to a baseboard that intermediates between the modules and the motherboard.

Figure 1:
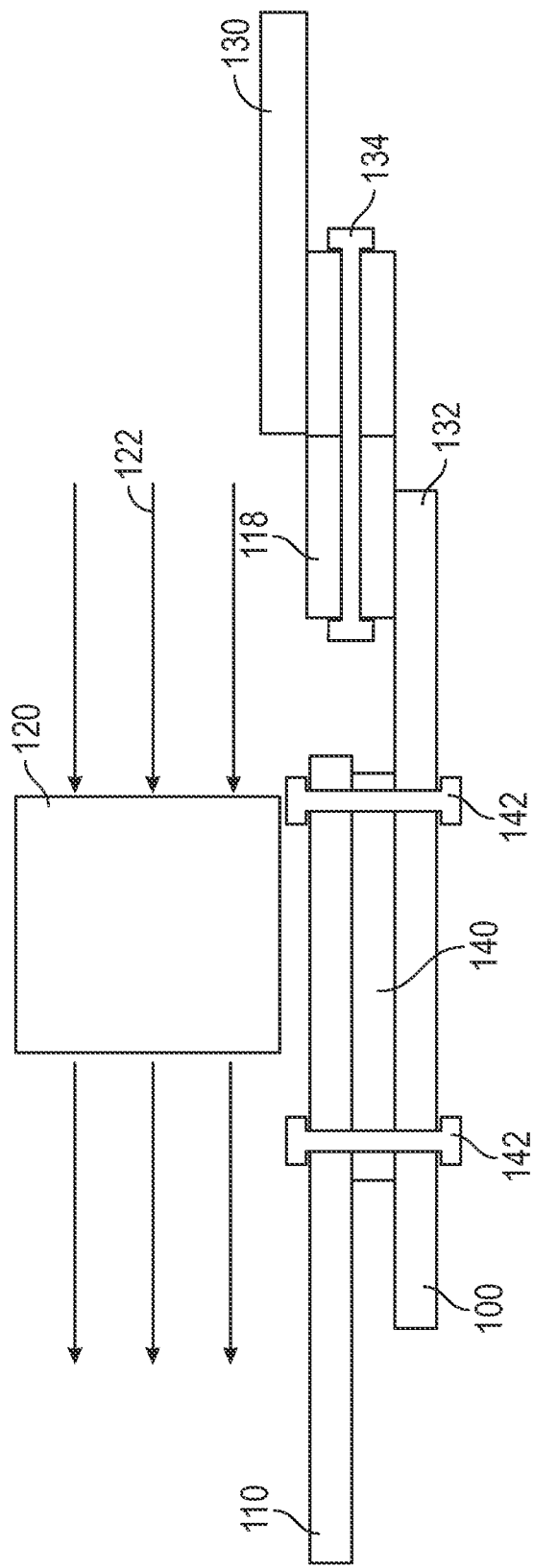
FIG. 1 is a cross-sectional side view illustration of an example system for cableless interconnects of a motherboard and an ancillary module to a baseboard, according to embodiments of the present disclosure.

FIG. 1 is a graphic illustration of cross-sectional side view of an example system for cableless interconnects, according to embodiments of the present disclosure. Baseboard 100 may be implemented as a printed circuit board (PCB). Baseboard 100 may be connected to a motherboard 110 using a connector 140. Connector 140 may have a low profile and may be implemented by, for example, a pin grid array, a solder ball grid array, an interposer, insulation displacement, or any other suitable connector. Baseboard 100, motherboard 110, and connector 140 may be firmly secured using fasteners 142, such as nuts and bolts, or screws. This may create a robust mechanical and electrical connection. Baseboard 100 may use a baseboard connector 118 to establish connectivity to an ancillary module 130. Examples of ancillary modules 130 include, but are not limited to devices, such as a hard drive caddy, backplane, USB hub, or any other suitable electronic device. Ancillary module 130 may have an ancillary connector 132, which mates with baseboard connector 118. Connectors 118 and 132 may be secured using a fastener 134 to create a robust mechanical and electrical connection. This may provide a low profile interconnect assembly between motherboard 110 and ancillary module 130 through baseboard 100.

Because there are no cable attachments on the upper, component side of motherboard 110, an airflow 122 through a fan 120 is unobstructed. Baseboard 100 may instead be located on the lower, non-component side of motherboard 110. Baseboard 100 may be constructed such that its thickness is less than 2 mm. Baseboard 100 may be fabricated such that it will carry at least two hundred connections via the associated signal paths through connector 140 and through baseboard connector 118 and ancillary connector 132. This configuration may provide an optimized, predictable airflow 122 across the components of motherboard 110, while ensuring full reliable connectivity between motherboard 110 and ancillary modules 130.

Baseboard 100 configurations may provide a well-defined profile, which may afford a predictable performance for calculating laminar airflow in the physical environment. Thus, the configuration may reduce any air flow changes due to cables and increase the mean time between failures (MTBF) for the system.

Physical connectors may be firmly attached, using fasteners 134 and 142 (e.g. nuts and bolts, or screws) to provide a mechanically stable solution for connectivity. This is especially true for connections between motherboard 110 and baseboard 100. Once baseboard 100 has been connected to motherboard 110, then connectivity to various modules can be handled by motherboard 110 or baseboard 100. This may be achieved using programmable differential amplifiers to enable or disable signal paths to baseboard connector 118 and ancillary connector 132, which provides selectable connectivity to baseboard connector 118 and ancillary connector 132 using common connections on baseboard 100.

The connector 140 of motherboard 110 to baseboard 100 may have a low profile. Similarly, baseboard connector 118 may have a low profile. As used in this disclosure, the term "low profile" means a profile that enables a connection with the distance between the connected elements being less than or equal to 2 mm.

Figure 2:
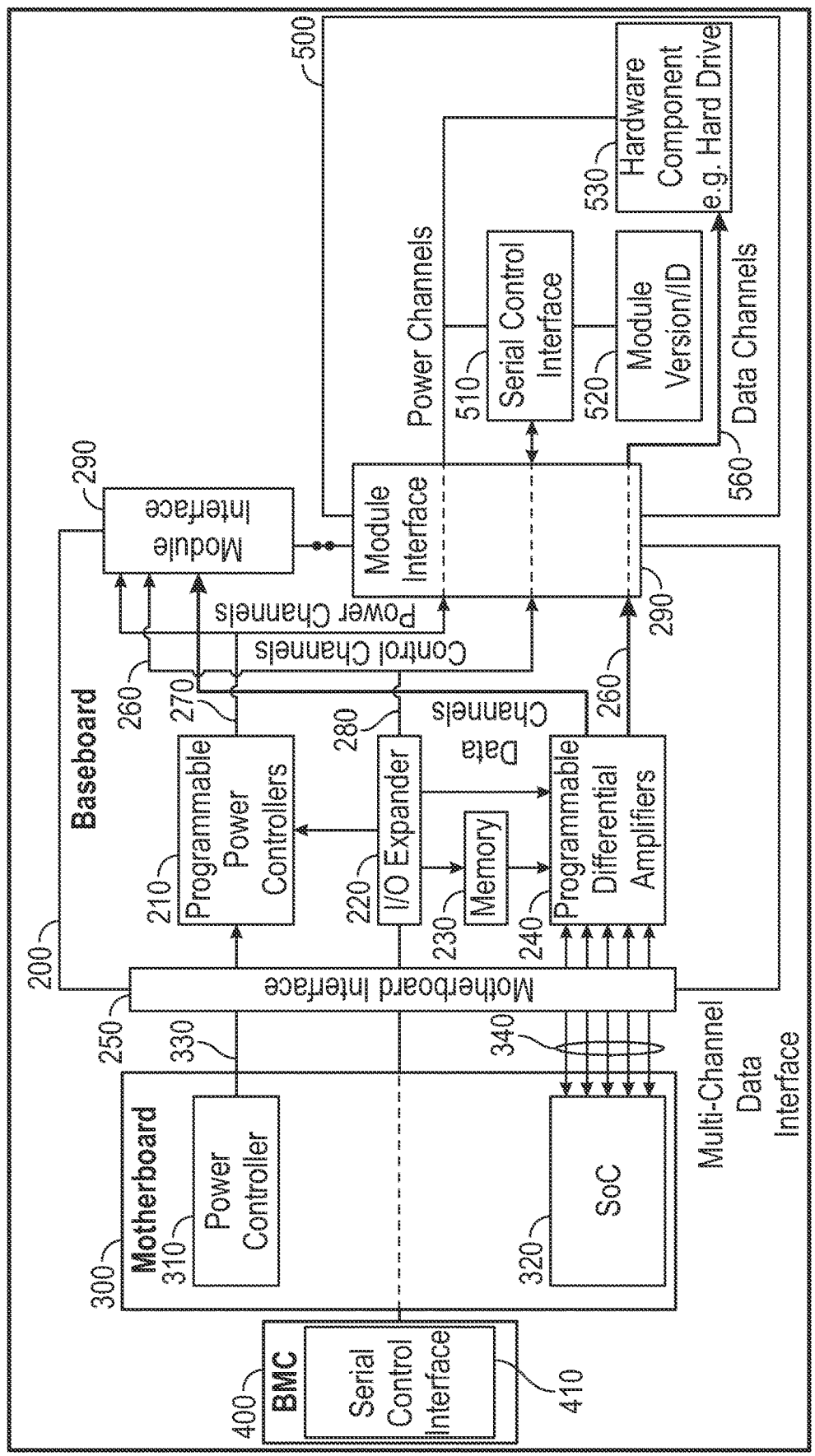
FIG. 2 illustrates a functional diagram for the system for cableless interconnects via interfaces for power, data, and control channels between a motherboard and an ancillary module through a baseboard, according to embodiments of the present disclosure.

FIG. 2 is a schematic illustration of a baseboard functional diagram for the system for cableless interconnects, according to embodiments of the present disclosure. The system may comprise a baseboard 200, a motherboard 300, a baseboard management controller 400, and one or more ancillary modules 500. One or more motherboard interfaces 250 provide power and data connectivity between baseboard 200 and motherboard 300. The motherboard interface(s) 250 may be physically enabled by connector 140 shown in FIG. 1. One or more module interfaces 290 provide power and data connectivity between baseboard 200 and ancillary modules 500. Module interfaces 290 may be physically realized as a baseboard connector 118 and ancillary connector 132 shown in FIG. 1. Baseboard management controller 400 may connect to motherboard 300 or to the baseboard 200 via motherboard interface 250.

Baseboard 200 may comprise programmable power controllers 210, I/O expander 220, memory 230, programmable differential amplifiers 240, data channels 260, power channels 270, and control channels 280. I/O expander 220 connects directly to programmable power controllers 210, memory 230, programmable differential amplifiers 240. Motherboard 300 may comprise a power controller 310, one or more system on chips (SoCs) 320, a power channel 330, and multi-channel data interface 340. Baseboard management controller 400 may have a serial control interface 410. Ancillary modules 500 may comprise a serial control interface 510, a module version/ID 520, a hardware component 530, data channels 560, power channels 570, and control channels 580.

Motherboard 300 may route a serial interface, such as I2C, from baseboard management controller 400 through motherboard interface 250 to an I/O expander 220 on baseboard 200, and further to module serial control interface 510 via ancillary module interface 290. Using serial controller interface 410, baseboard management controller 400 can determine the motherboard, baseboard, module types and versions. This determination is used to provide programming data for programmable power controllers 210, memory 230, and programmable differential amplifiers 240. The serial interface controller 510 queries module version/ID 520 and the information is passed back to serial interface controller 410 of baseboard management controller 400.

Programmable differential amplifiers 240 may be programmed to handle a wide range of different signal levels and frequencies. This enables the data channels to be agnostic toward the specific communication standard that is being used for the data. Connectivity to various ancillary modules 500 can be handled by motherboard 300. This may be achieved using programmable differential amplifiers 240 to enable or disable signal paths to module interface 290. This may provide selectable connectivity to module interface 290 using common connections on baseboard 200.

Unlike standardized server architectures (e.g. fixed PCIe over electrical interfaces as defined by the standard), the motherboard is not specifically designed for a standard interconnect. Instead, the connectivity via the backplane may be determined at power on. Interconnections may be configurable. Baseboard management controller 400 may determine based on the version/id of the ancillary module the following: 1) the power supply to be used by the modules, for example, an SSD might require 3.3 V, while an Ethernet card might require 5.0 V; 2) the type of data interfaces required, such as PCIe 1.0-3.0, SATA, USB, and Ethernet; 3) the number of data channels per ancillary module; and 4) the signal conditioning per data interface. Using this information, programming may be generated by the motherboard SoC 320 and power controller 310. The programming may then be sent to baseboard programmable power controllers 210, I/O expander 220, and programmable differential amplifiers 240.

Motherboard 300 may contain power controller 310. Power controller 310 may be configured to provide the power supply to baseboard 200. Motherboard 330 may also have one or more SoC 320. This provides data connections 340 to baseboard 200. These are multiple and may contain different communications protocols and standards. Motherboard interfaces 250 are selected to handle a wide variety of transmission requirements, allowing these signals to be connected to programmable differential amplifiers 240 on baseboard 200. Initially, unlike standard systems, the data interfaces and power are not supplied to ancillary modules 500 at power on. Instead, the requirements for each ancillary module 500 are established by programming from baseboard management controller 400. Baseboard 200 can then supply the correct power levels and data connectivity to ancillary modules 500.

Power supply 330 from motherboard 300 is connected to programmable power controllers 210 on baseboard 200. Individual connections 270 from programmable power controller 210 are made to each of module interfaces 290. The power levels for each module can be individually programmed by serial controller interface 410 on baseboard management controller 400. Baseboard management controller 400 determines the module type/version, then sets the power levels to a predefined level that is specifically designed for each module explicitly. Baseboard management controller 400 can also remove all power from any or all modules in the case where one or more ancillary modules 500 are to be removed.

System on chip (SoC) 320 logically connects to ancillary modules 500 to motherboard 300 via baseboard 200. Data connections 340 may depend on the type/version of motherboard 300 and type/version 520 of ancillary modules 500 connected to baseboard 200. Programmable differential amplifiers 240 then provide multi-channel data interfaces 340 to data channels 560 of the individual ancillary modules 500. Baseboard management controller 400 may program the programmable differential amplifiers 240 to specifically match the requirements using signal gain and conditioning for the individual signals to/from motherboard 340 and ancillary modules 500. The adjustment of the signal gain and conditioning can be used in conjunctions with transmission errors, to determine an optimal operating level. The settings can also be stored in memory 230 on baseboard 200. This provides a mechanism, for example, to configure the individual signal amplification levels and signal conditioning at the time of manufacture, and later "fine tune" them in the field. Baseboard 200 provides a superset of data signals both for motherboard 300 and module interface 290. Baseboard management controller 400 will instruct programmable differential amplifier 240 to disable any unused signals. This will both save power and also prevent interference with active signals.

In a system using cable connections, the transmission characteristics are predefined using customized drivers and tuned cables. Alternatively, the present invention may use programmable differential amplifiers the overcome the disadvantage of matching various protocol or standard types to the fixed PCB traces on baseboard 200 and ancillary modules 500. For example, PCIe 1.0 operates at 2.5 GHz, but PCIe 3.0 operates at 8 GHz. The same PCB tracks can be used for either connection type. The programmable differential amplifiers may be programmed differently to ensure the transmission medium is compatible with the different frequencies, encoding schemes, or nominal electrical impedances.

With reference to FIGS. 1 and 2, baseboard 100, 200 may have a further advantage over cables wherein baseboard 100, 200 may accommodate multiple different motherboard designs and ancillary module configurations. For example, a motherboard 110, 300 may contain a single system on chip (SoC) or multiple systems on chip (e.g. four SoCs). Motherboard 110, 300 may also connect to various ancillary module 130, 500 types, such as hard drives, video processing chips, networking cards, etc. The particular function of a data channel in baseboard 100, 200 is a function of motherboard 110, 300 to ancillary module 130, 500 connectivity.

The drivers on baseboard 100, 200 may be universal. Active, programmable components therein may facilitate this adaptability. To support the data connectivity, baseboard 100, 200 may be configured to handle a wide variety of signals with the same interface. So instead of discrete interfaces, PCIe, SATA, USB Ethernet, a single connector can be used that is protocol or standard agnostic. Motherboard 110, 300 may send out such signals, and baseboard 100, 200 may handle any such interface through programmable gain, signal conditioning, and amplifiers.

For example, one configuration could be a motherboard 110, 300 with one ARM processor connecting to four ancillary modules 130, 500 that contain SATA-based solid state drives. In this configuration, the data channels will be used for SATA interfaces. In another configuration, motherboard 110, 300 will contain two processors with four CPUs. These will connect to sixteen ancillary modules 130, 500 each containing a video processor ASIC. In this case, there will be sixteen PCIe channels from motherboard 110, 300 to ancillary modules 130, 500. Baseboard 100, 200 may amplify and condition these signals such that they can traverse the physical connection and maintain a low transmission error rate.

Baseboard 100, 200 may have further advantages that can be provided through additional functionality above a discrete connector/cabling solution. Baseboard 100, 200 may provide control signals from a baseboard management controller 400. Baseboard management controller 400 can use this to discover the specific ancillary module 130, 500 and motherboard 110, 300 that has been connected, and perform the associated signal amplification and conditioning. Furthermore, the baseboard management controller 400 may provide programming instructions to baseboard 100, 200 based on the results.

Using programmable power controllers 210, baseboard management controller 400 may provide the exact power levels that a specific ancillary module 130, 500 requires via the common physical connections. For example, SATA HDDs and SSDs have 12 V, 5 V, and 3.3 V requirements depending on the drive configuration. Because 3.3 V is a new standard, many older systems do not supply this power via the hard drive connector. Using a programmable power controller 210 not only can provide current protocol or standard signals, but also future protocol or standard signals through reprogramming.

Programmable differential amplifiers 240 may be used to ensure that the signal level to and from the System on Chip (SoC) 320 on a motherboard 110, 300 are compatible with ancillary module 130, 500 signal levels. Amplifiers 240 may be programmed by baseboard management controller 400 for a specific ancillary module 130, 500 and motherboard 110, 300 configuration. Further, baseboard 100, 200 may contain a non-volatile memory 230 to store specific amplifier 240 settings so they can be used repeatedly, especially after power cycling of the system.

BMC 400, SoC 230, programmable power controllers 210, power controller 310, and programmable differential amplifiers 340 may be implemented in any suitable manner, such as by analog circuitry, digital circuitry, instructions for execution by a processor, or any suitable combination thereof. Moreover, the functionality of any of these elements might be implemented instead by another one of such elements. For example, any of these, implemented as a circuit, including analog circuitry, digital circuitry, instructions for execution by a processor, or any suitable combination thereof, may be configured to determine the protocols or standards to be used in communication with module interfaces, a motherboard, and ancillary modules. The circuit may be configured to determine connections and disconnections from the baseboard connectors and ancillary modules using any one of a multiple different protocols or standards, and enable communication channels between the motherboard and the ancillary modules.

Figure 3A:
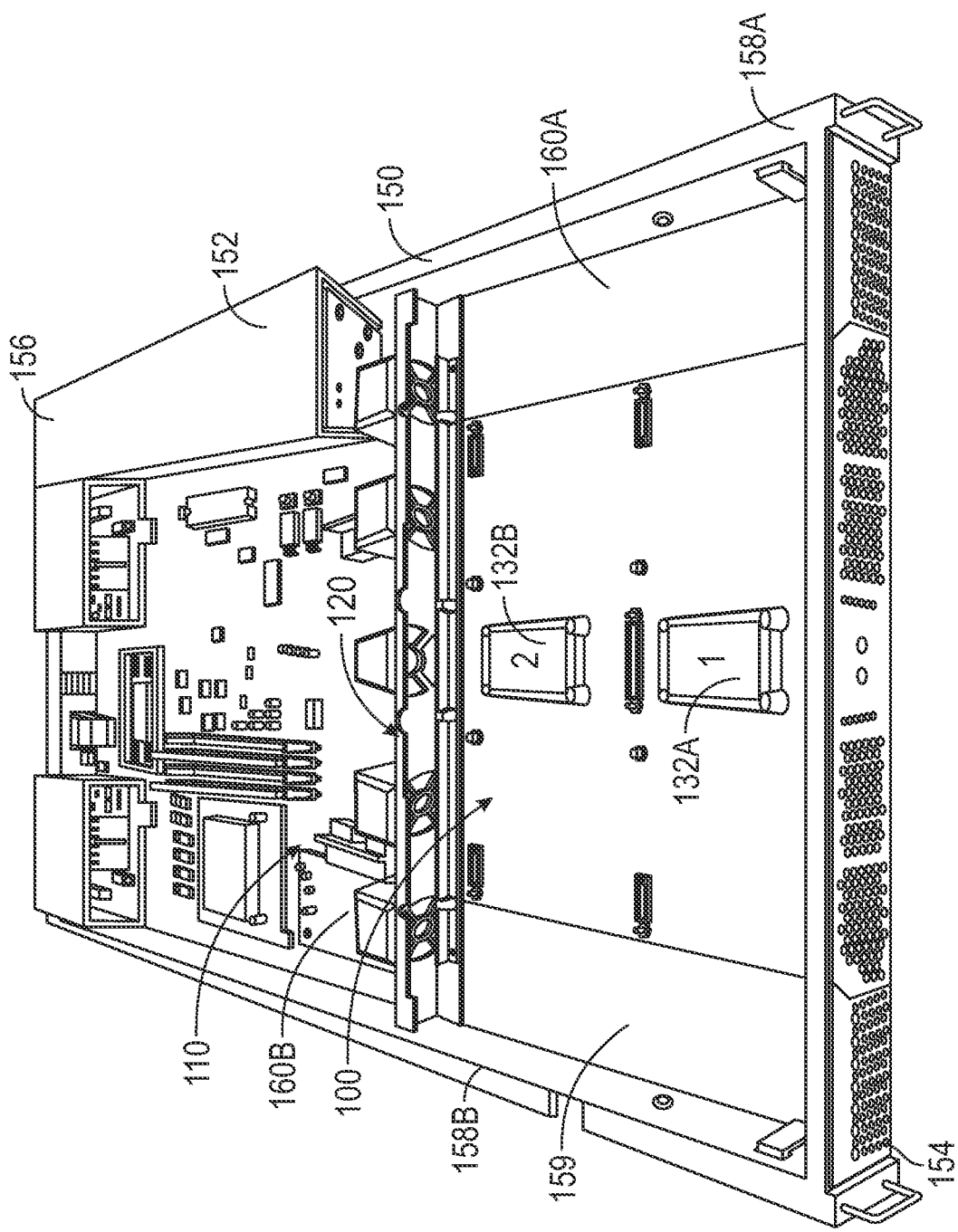
FIG. 3A is an illustration of an example chassis including a system for cableless interconnects between a motherboard and an ancillary module from an elevated, angled view, according to embodiments of the present disclosure.

FIG. 3A shows a perspective view of a rack chassis 150 including an example system for cableless interconnects. Chassis 150 may be a standard rectangular rackmount server chassis with a front panel 154, an IO shield backplane 156, two side walls 158A and 158B, and a bottom wall 159. Chassis 150 includes a compartment 152 for additional electronic modules such as hard drives. A central fan bar 120 extends between side walls 158A and 158B and divides the interior of chassis 150 into a front bay 160A and a rear bay 160B. A baseboard 100 is positioned in chassis 150 directly on bottom wall 159 and extends from front bay 160A to rear bay 160B under central fan bar 120. A motherboard 110 is positioned on top of baseboard 100 in rear bay 160B. Baseboard 100 has two ancillary connectors 132A and 132B positioned in front bay 160A. Ancillary connectors 132A and 132B may have a low profile and may be implemented by, for example, a pin grid array, a solder ball grid array, an interposer, insulation displacement, or any other suitable connector. Ancillary modules 130 (not shown) may each be positioned and supported by a caddie within front bay 160A of chassis 150. The caddie assemblies enable ancillary modules 130, 500 to plug into or otherwise connect with ancillary connectors 132A and 132B, so there is no cabling to or from motherboard 110.

Figure 3B:
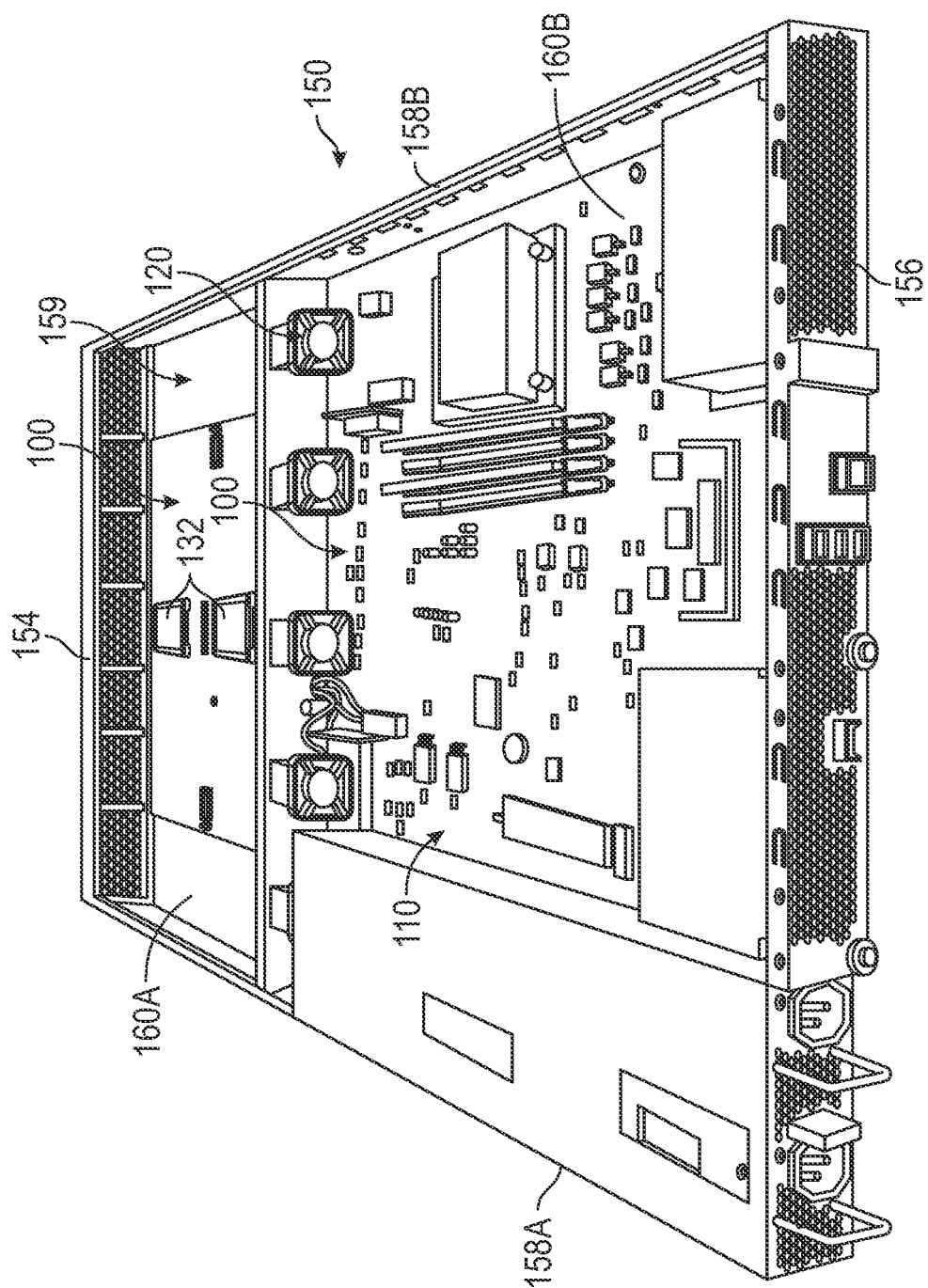
FIG. 3B is another illustration of the example chassis including the system for cableless interconnects shown in FIG. 3A from a reverse elevated, angled view, according to embodiments of the present disclosure.

FIG. 3B shows a perspective view of rack chassis 150 including the example system for cableless interconnects as shown in FIG. 3A, except the view is from the opposite end. Chassis 150 has a front panel 154, an 1O shield backplane 156, two side walls 158A and 158B, and a bottom wall 159. Central fan bar 120 extends between side walls 158A and 158B and divides the interior of chassis 150 into a front bay 160A and a rear bay 160B. Baseboard 100 is positioned on the bottom wall of chassis 150 and extends from front bay 160A to rear bay 160B. Baseboard 100 has two ancillary connectors 132 positioned in front bay 160A. Motherboard 110 is electrically connected to baseboard 100 in rear bay 160B.

Figure 3C:
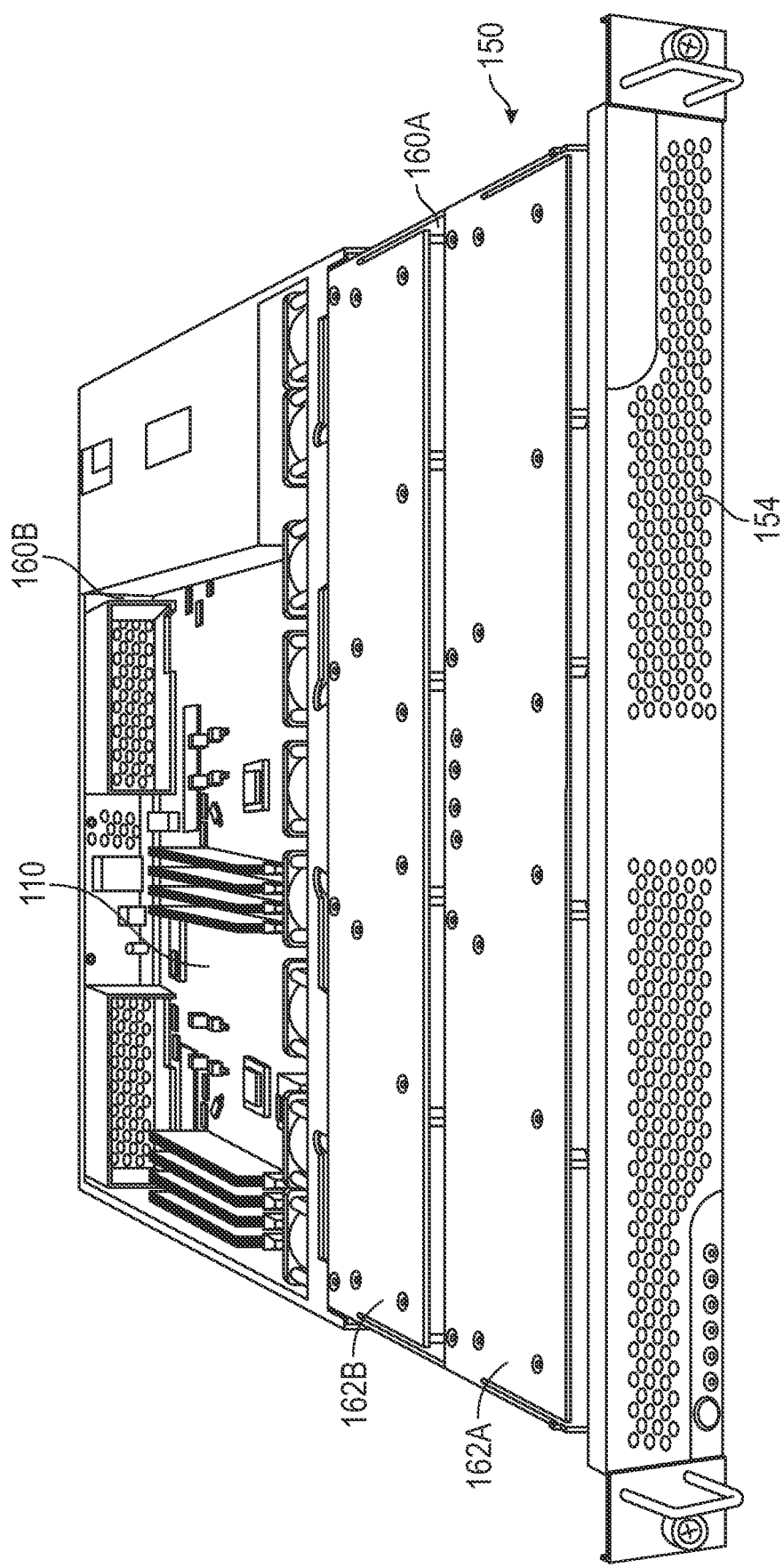
FIG. 3C is another illustration of the example chassis including the system for cableless interconnects shown in FIGS. 3A and 3B from an elevated, angled view wherein caddie modules have been inserted, according to embodiments of the present disclosure.

FIG. 3C is another illustration of chassis 150 as shown in FIGS. 3A and 3B, except caddies for ancillary modules that are assembled therein. In this view, front panel 154 is at the front, so that front bay 160A is in the foreground and rear bay 160B is in the rear ground. Two caddies 162A and 162B are assembled in front bay 160A. Inside each caddie 162A and 162B, there is an ancillary module 130, 500 (not shown) connected to ancillary connectors 132A and 132B (see FIG. 3A).

Figure 4:
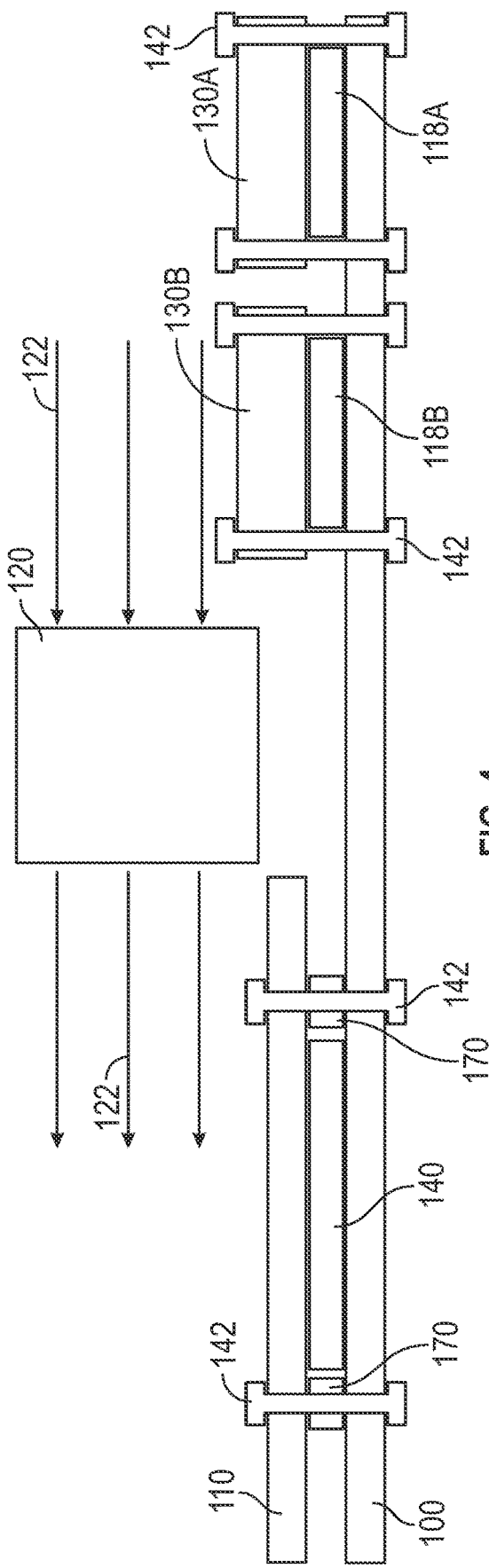
FIG. 4 is a cross-sectional side view illustration of an example system for cableless interconnects of a motherboard and an ancillary module to a baseboard, according to embodiments of the present disclosure.

FIG. 4 is a graphic illustration of a cross-sectional side view of an example system for cableless interconnects. Baseboard 100 may be implemented as a printed circuit board (PCB). A motherboard 110 may be connected to baseboard 100 using a connector 140, which in this example is an interposer having spring contact arrays. A spacer element 170 is positioned around the interposer to maintain a distance of separation between motherboard 110 and baseboard 100 so that the interposer may float therebetween to allow even contact force distribution across the spring contact arrays. Baseboard 100, motherboard 110, and spacer element 170 may be firmly secured using fasteners 142, such as nuts and bolts. A first ancillary module 130A is connected communicatively to baseboard 100 via a baseboard connector 118A and physically connected via fasteners 142. A second ancillary module 130B is connected communicatively to baseboard 100 via a baseboard connector 118B and physically connected via fasteners 142. Ancillary modules 130A and 130B are connected to baseboard 100 opposite where motherboard 110 is connected to baseboard 100 so that a fan 120 is positioned between.

Figure 5:
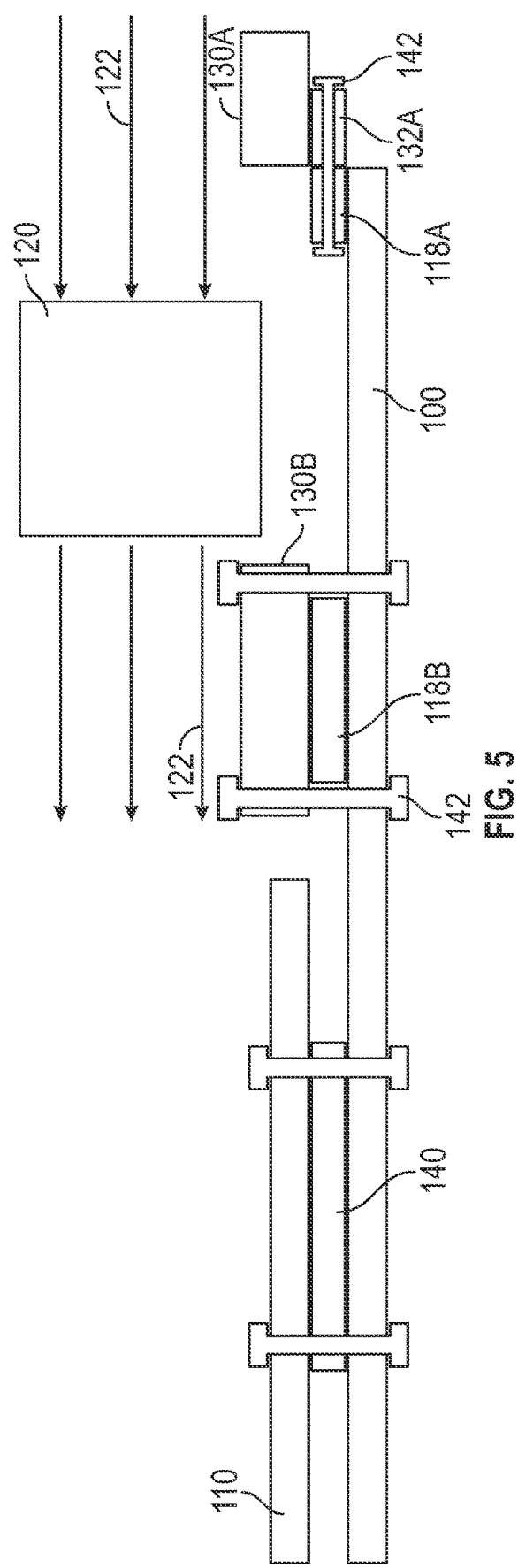
FIG. 5 is a cross-sectional side view illustration of an example system for cableless interconnects of a motherboard and an ancillary module to a baseboard, according to embodiments of the present disclosure.

FIG. 5 is a graphic illustration of a cross-sectional side view of an example system for cableless interconnects. Baseboard 100 may be implemented as a printed circuit board (PCB). A motherboard 110 may be connected to baseboard 100 using a connector 140, which in this example is an interposer having spring contact arrays. Baseboard 100, motherboard 110, and connector 140 may be firmly secured using fasteners 142, such as nuts and bolts. A first ancillary module 130A is communicatively and physically connected to baseboard 100 via a baseboard connector 118A and an ancillary connector 132A, wherein fasteners 142 secure the connectors. A second ancillary module 130B is connected communicatively to baseboard 100 via a baseboard connector 118B and physically connected via fasteners 142. Ancillary modules 130A and 130B are connected to baseboard 100 opposite where motherboard 110 is connected to baseboard 100. A fan 120 is positioned between ancillary modules 130A and 130B.

Figure 6:
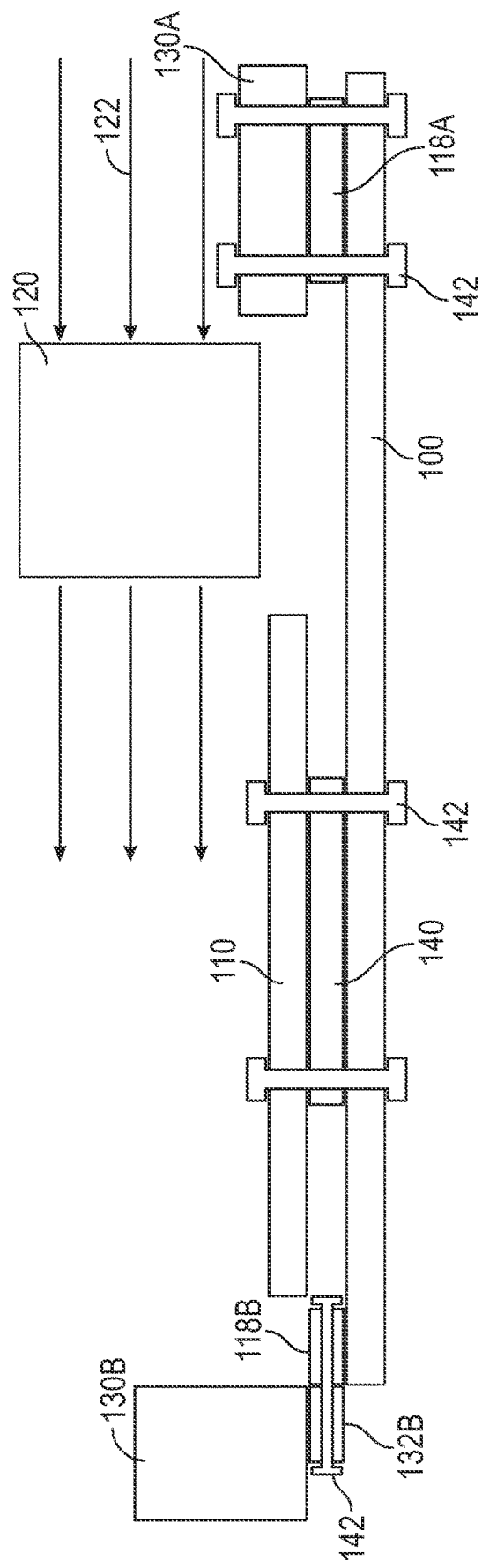
FIG. 6 is a cross-sectional side view illustration of an example system for cableless interconnects of a motherboard and an ancillary module to a baseboard, according to embodiments of the present disclosure.

FIG. 6 is a graphic illustration of a cross-sectional side view of an example system for cableless interconnects. Baseboard 100 may be implemented as a printed circuit board (PCB). A motherboard 110 may be connected to baseboard 100 using a connector 140. Baseboard 100, motherboard 110, and connector 140 may be firmly secured using fasteners 142, such as nuts and bolts. A first ancillary module 130A is communicatively connected to baseboard 100 via a baseboard connector 118A and physically connected via fasteners 142. A second ancillary module 130B is communicatively and physically connected to baseboard 100 via a baseboard connector 118B and an ancillary connector 132B, wherein fasteners 142 secure the connectors. Ancillary modules 130A and 130B are connected to baseboard 100 opposite to each other with motherboard 110 connected between. A fan 120 is positioned between motherboard 110 and first ancillary module 130A.

In the example illustrations of the invention shown in FIGS. 4, 5, and 6, baseboard 100 is located on the lower, non-component side of motherboard 110 and ancillary modules 130A and 130B. Baseboard 100 may be constructed such that its thickness is less than 2 mm. Connector 140 and baseboard connectors 118A and 118B may each have a low profile so that the connected boards are less than 5 mm apart. Because there are no cable attachments on the upper, component side of motherboard 110 and ancillary modules 130A and 130B, an airflow 122 through fan 120 is unobstructed.

The components of the system described above may be implemented in digital circuitry, analog circuitry, instructions for execution by a processor, or any suitable combination thereof. In particular, baseboard management controller 400 may be implemented as a switch circuit in software, in hardware, or a combination of software and hardware.

One example of the invention includes a baseboard 100, 200 having a first connection configured to electrically interface with a motherboard 110, 300 a second connection configured to electrically interface with an ancillary module 130, 500, and a switch circuit configured to route data channels 260 and power channels 270 between motherboard 110, 300 and ancillary module 130, 500. The first connection is configured to interface with more than one connection protocol or standard. The second connection is configured to interface with the more than one connection protocol or standard.

Although the disclosed embodiments are described in detail in the present disclosure, it should be understood that various changes, substitutions and alterations can be made to the embodiments without departing from their spirit and scope. Those in the art will understand that a number of variations may be made in the disclosed embodiments, all without departing from the spirit and scope of the invention, which is defined solely by the appended claims.

What is claimed is:

1. A baseboard, including:
    a printed circuit board;
    a motherboard interface configurable to allow communications between the printed circuit board and a motherboard; and
    a first ancillary module interface configurable to allow communications between the printed circuit board and a first ancillary module;
    wherein:
        the motherboard interface is configured to communicate with a plurality of protocols or standards to enable a communication channel between the motherboard and the ancillary module; and
        the first ancillary module interface is configured to communicate with a plurality of protocols or standards to enable the communication channel between the motherboard and the ancillary module;
    further comprising a programmable differential amplifier configurable to provide a plurality of signal conditioning options for data channels conforming to a protocol of the first ancillary module.

2. The baseboard of claim 1, further comprising a connector of the printed circuit board connectable to the motherboard and a baseboard connector of the printed circuit board connectable to the first ancillary module, wherein the connector and baseboard connector are positioned toward opposite ends of the printed circuit board.

3. The baseboard of claim 1, further comprising a programmable power controller configured to provide a power supply voltage conforming to connection protocols of the motherboard interface or the first ancillary module interface.

4. The baseboard of claim 1, further comprising a second ancillary module interface configurable to allow communications between the printed circuit board and a second ancillary module, wherein the first and second ancillary module interfaces are configured to simultaneously enable communication channels between the motherboard and the first and second ancillary modules, wherein the first and second ancillary module interfaces are configured with different protocols.

5. The baseboard of claim 4, wherein the motherboard interface is configured with a protocol or standard that is different than the protocol or standard configured for the first ancillary module interface.

6. The baseboard of claim 1, wherein the communication channel enabled between the first ancillary module and the motherboard is cableless.

7. The baseboard of claim 1, further comprising a circuit configured to:
    determine a disconnection from a baseboard connector of the first ancillary module using a protocol or standard of the first ancillary module;
    determine a connection to the baseboard connector of a second ancillary module using a protocol or standard of the second ancillary module; and
    enable a communication channel between the motherboard and the second ancillary module.

8. The baseboard of claim 1, wherein the communication channel is a power channel.

9. The baseboard of claim 1, wherein the communication channel is a data channel.

10. The baseboard of claim 1, wherein the communication channel is a control channel.

11. The baseboard of claim 1, wherein:
    the motherboard includes a first side and a second side opposite the first side;
    the motherboard is configured to connect to a fan on the first side; and
    the baseboard is configured to connect to the motherboard on the second side.

12. A baseboard, including:
    a printed circuit board;
    a motherboard interface configurable to allow communications between the printed circuit board and a motherboard; and
    a first ancillary module interface configurable to allow communications between the printed circuit board and a first ancillary module;
    wherein:
        the motherboard interface is configured to communicate with a plurality of protocols or standards to enable a communication channel between the motherboard and the ancillary module; and
        the first ancillary module interface is configured to communicate with a plurality of protocols or standards to enable the communication channel between the motherboard and the ancillary module;
    further comprising a programmable power controller and a programmable differential amplifier configured to dynamically assign power levels and signal conditioning to power channels and data channels based upon a protocol or standard of the motherboard or the first ancillary module.

13. A baseboard, including:
a printed circuit board;
a motherboard interface configurable to allow communications between the printed circuit board and a motherboard; and
a first ancillary module interface configurable to allow communications between the printed circuit board and a first ancillary module;
wherein:
    the motherboard interface is configured to communicate with a plurality of protocols or standards to enable a communication channel between the motherboard and the ancillary module; and
    the first ancillary module interface is configured to communicate with a plurality of protocols or standards to enable the communication channel between the motherboard and the ancillary module;
further comprising a memory to store power levels and signal conditioning settings to be used based upon a protocol of the motherboard or the first ancillary module.

14. A chassis computer system, including:
a baseboard comprising:
    a printed circuit board;
    a motherboard interface configurable to allow communications between the printed circuit board and a motherboard;
    a first ancillary module interface configurable to allow communications between the printed circuit board and a first ancillary module; and
    a baseboard management controller that configures the motherboard interface with a protocol of the motherboard and configures the first ancillary module interface with a protocol of the first ancillary module to enable a communication channel between the motherboard and the ancillary module;
a motherboard;
a connector of the motherboard to the baseboard;
a first ancillary module;
a baseboard connector of the first ancillary module to the baseboard; and
a fan;
wherein the baseboard comprises a programmable differential amplifier configurable to provide a plurality of signal conditioning options for data channels conforming to a protocol of the first ancillary module.

15. The chassis computer system of claim 14, wherein the connector of the motherboard to the baseboard comprises a connector selected from: a pin grid array, a solder ball grid array, an interposer, and an insulation displacement.

16. The chassis computer system of claim 14, wherein the connector of the motherboard to the baseboard comprises a low profile connector and the motherboard is connected to the baseboard with a distance of separation less than or equal to 2 mm.

17. The chassis computer system of claim 14, wherein the baseboard connector of the first ancillary module to the baseboard comprises a baseboard connector selected from: a pin grid array, a solder ball grid array, an interposer, and an insulation displacement.

18. The chassis computer system of claim 14, wherein the baseboard connector of the first ancillary module to the baseboard comprises a low profile baseboard connector and the first ancillary module is connected to the baseboard with a distance of separation less than or equal to 2 mm.

19. The chassis computer system of claim 14, wherein the connector of the motherboard to the baseboard, wherein the connector is cableless, and the motherboard interface allows communications through the connector.

* * * * *